United States Patent
Daoud

(10) Patent No.: US 6,302,725 B1
(45) Date of Patent: Oct. 16, 2001

(54) SELF-LATCHING TERMINAL STRIP

(75) Inventor: Bassel H. Daoud, Parsippany, NJ (US)

(73) Assignee: Avaya Technology Corporation, Basking Ridge, NJ (US)

( * ) Notice: Subject to any disclaimer, the term of this patent is extended or adjusted under 35 U.S.C. 154(b) by 0 days.

(21) Appl. No.: 09/217,119

(22) Filed: Dec. 21, 1998

(51) Int. Cl.⁷ .................................................. H01R 11/18
(52) U.S. Cl. ......................... 439/482; 439/849; 439/358
(58) Field of Search ................................... 439/482, 848, 439/849; 324/72.5

(56) References Cited

U.S. PATENT DOCUMENTS

| | | |
|---|---|---|
| 1,917,683 | 7/1933 | Anderson . |
| 1,926,936 | 9/1933 | Casingena et al. . |
| 2,732,446 * | 1/1956 | Gilmore . |
| 2,895,119 | 7/1959 | Montgomery, Jr. . |
| 2,920,303 | 1/1960 | Johnson . |
| 3,038,141 | 6/1962 | Chiuchiolo . |
| 3,134,632 | 5/1964 | Kimball et al. . |
| 3,546,664 * | 12/1970 | DeBolt . |
| 3,571,779 | 3/1971 | Collier . |
| 3,609,647 | 9/1971 | Castellano . |
| 3,611,264 | 10/1971 | Ellis . |
| 3,885,850 | 5/1975 | Witte et al. . |
| 3,918,784 | 11/1975 | Lemke et al. . |
| 3,937,995 * | 2/1976 | DeVito . |
| 4,232,924 | 11/1980 | Kline et al. . |
| 4,342,495 * | 8/1982 | Bennett . |
| 4,394,620 * | 7/1983 | Montalto et al. .................... 324/72.5 |
| 4,398,073 | 8/1983 | Botz et al. . |
| 4,491,381 * | 1/1985 | Hamsher, Jr. et al. . |
| 4,662,699 | 5/1987 | Vachhani et al. . |
| 4,793,823 | 12/1988 | Cozzens et al. . |
| 4,822,290 | 4/1989 | Cauley et al. . |
| 4,947,115 * | 8/1990 | Siemon et al. ...................... 324/72.5 |
| 5,240,432 | 8/1993 | Daoud . |
| 5,431,578 | 7/1995 | Wayne . |
| 5,454,729 | 10/1995 | Wen-Te . |
| 5,477,161 | 12/1995 | Kardos et al. . |
| 5,614,820 | 3/1997 | Aoyama et al. . |
| 5,637,011 | 6/1997 | Meyerhoefer et al. . |
| 5,860,829 | 1/1999 | Hower et al. . |
| 6,129,575 | 12/1998 | Daoud . |
| 6,129,577 | 12/1998 | Daoud . |

* cited by examiner

*Primary Examiner*—Neil Abrams
(74) *Attorney, Agent, or Firm*—Stroock & Stroock & Lavan LLP

(57) ABSTRACT

An insulation displacement connector may have wire insertion holes, a cap pivotally mounted on a top section, and terminals that have a retention channel for latching to a test lead of a bridge clip. The bridge clip may have resilient latch arms for retention of the bridge clip to the insulation displacement connector. The latch arms may be movable from a closed (latched) position to an open (unlatched) position.

14 Claims, 4 Drawing Sheets

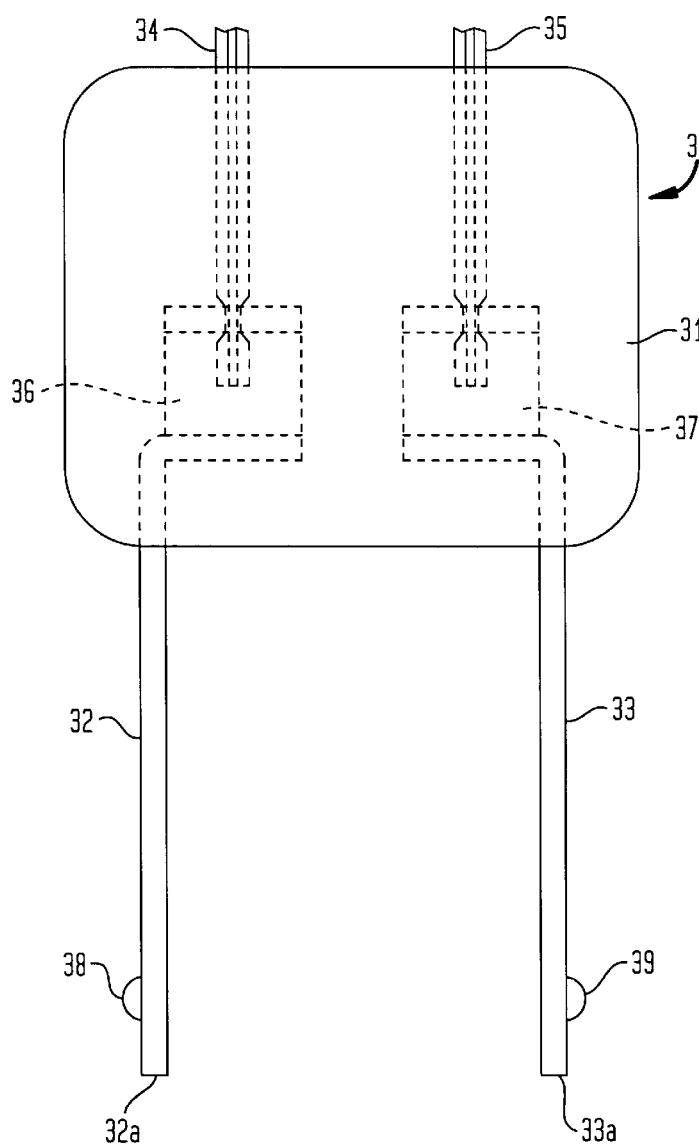
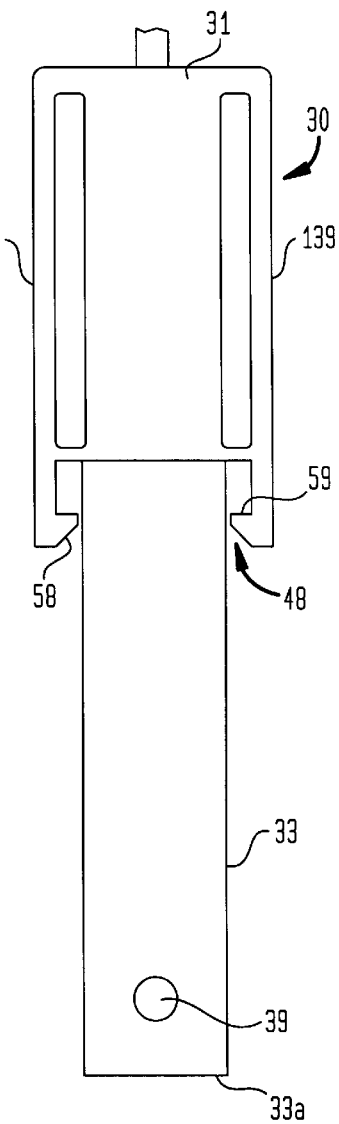
FIG. 4
FIG. 5

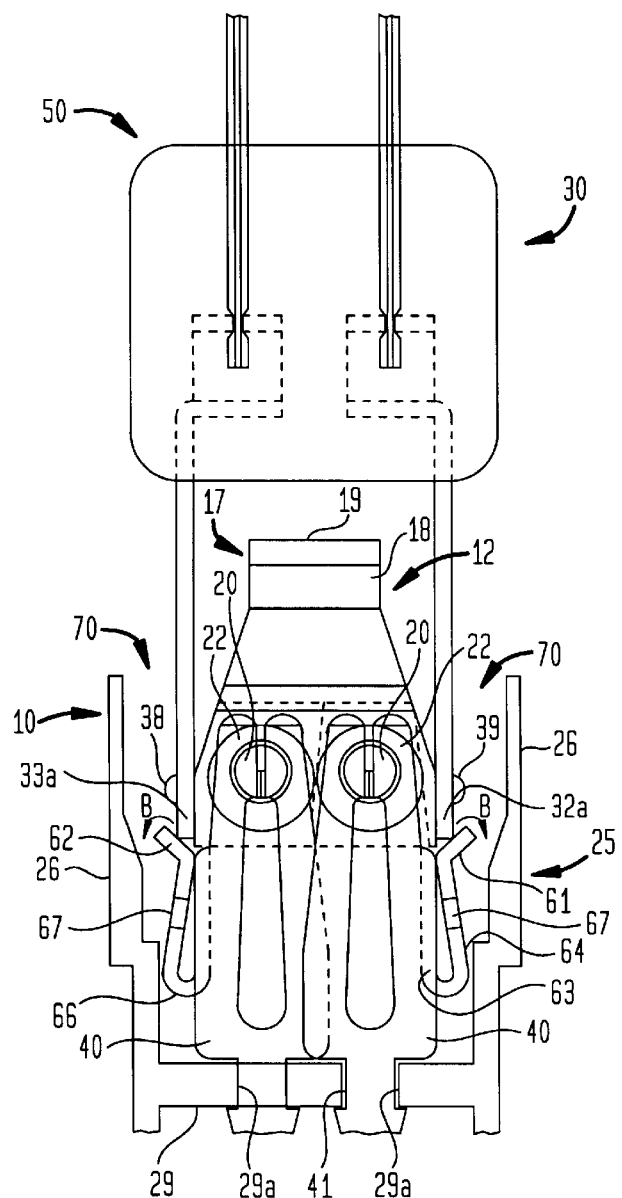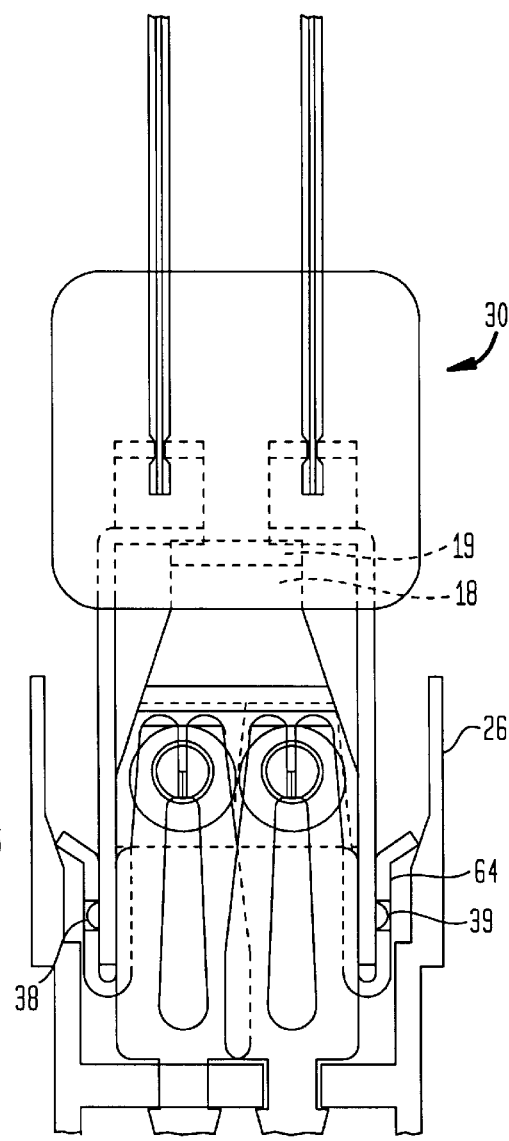

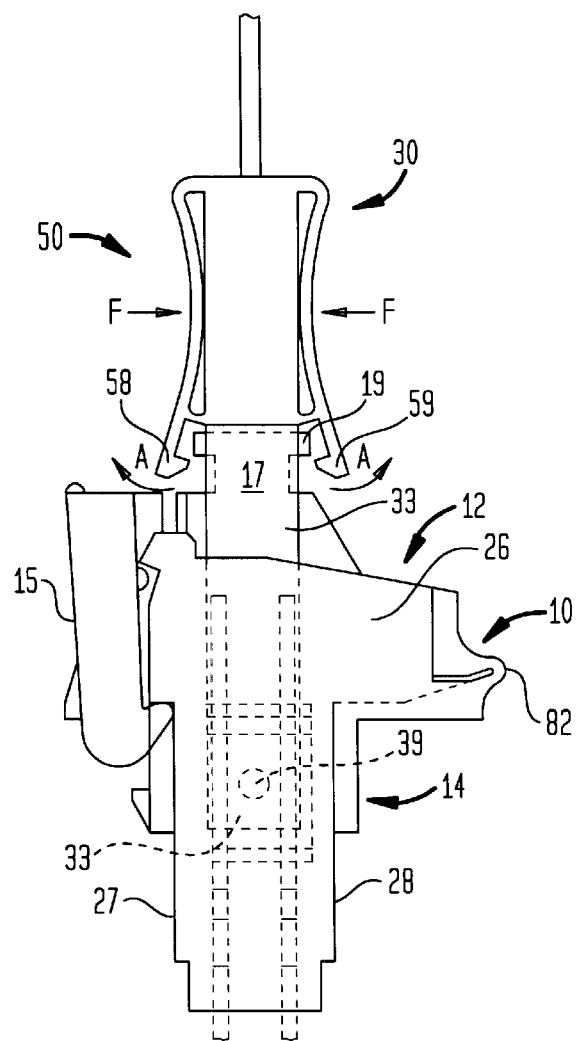
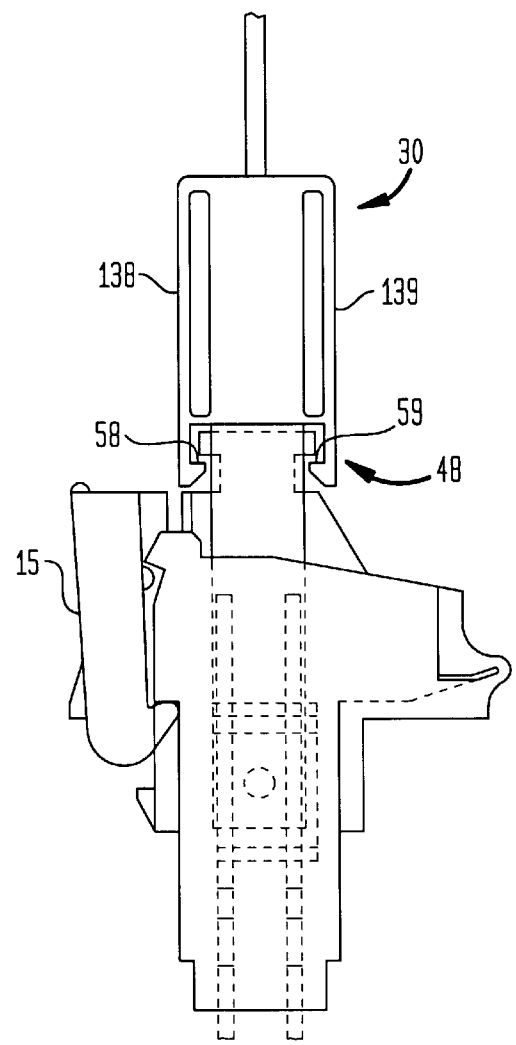
FIG. 7A
FIG. 7B

SELF-LATCHING TERMINAL STRIP

FIELD OF THE INVENTION

This invention relates to the field of telephone wire connector blocks and distribution systems, and specifically to a connector and a test device for testing wiring connected to the connector.

BACKGROUND OF INVENTION

In a telephone network, a network cable from the central office is connected to a building entrance protector (BEP) located at the customer site, where the individual telephone lines are broken out line-by-line. The network cable, which consist of a plurality of tip-ring wire pairs that each represent a telephone line, is typically connected to a connector block that forms a part of the BEP. Such connectors may be, for example, mini rocker tool-less insulation displacement (IDC)-type connectors, such as, for example, those sold by A.C. Egerton, Ltd. Other connectors used for telephony wiring applications are described in U.S. Pat. No. 4,662,699 to Vachhani et al., dated May 5, 1987, and in U.S. Pat. No. 3,611,264 to Ellis, dated Oct. 5, 1971.

The customer telephone equipment is coupled through such an IDC connector to, for example, a central office telephone line. The connector generally has a top section that includes two wire insertion holes and a bottom section that houses a pair of terminal strips. The wire insertion holes each accommodate one wire of a tip-ring wire pair. The top section pivots about a generally hinged fixed axis located on the side opposite the wire insertion holes and has a movable clasp for maintaining the top section in its closed position.

To open the top section, a user releases the clasp member and pivots the top section to its open position. When the top section is in its open position, the terminal strips do not intersect the wire insertion holes, but when the top section is in its closed position, the terminal strips intersect the wire insertion holes. Therefore, to establish an electrical and mechanical connection between the wires and the terminal strips, a user first opens the top section (i.e., pivots the top section to its open position), inserts the pair of wires, and then closes the top section. Upon closing the top section of the connector, the wires are brought into electrical and mechanical contact with the terminal strips. To remove the wires and/or break the electrical connection, the process is reversed.

To verify the integrity of a telephone line, the telephone line may be tested at the connector using a bridge clip. The bridge clip includes a body, at least a first test prong and a second test prong connected to the body, and lead wires for connecting the first and second test prongs to a testing device, such as a volt meter or telephone test set. The bottom section of the connector includes two channels, each located adjacent a terminal strip and sized to accommodate a test prong of a bridge clip. The test prongs are spaced apart and constructed to be received within the channels.

Testing is typically performed by inserting the test prongs of a bridge clip into the channels of the bottom section of the connector until each of the test prongs contacts an outside edge of one of the pair of terminal strips housed within the bottom section to make an electrical connection. If a current flow is detected, or a dial tone is heard, depending on the test methodology, then a loop condition exists for that particular tip-ring wire pair, and the integrity of the line is verified. If no loop condition is found, either an electrical open or short exists in telephone line or a connection to or in the terminal block is defective.

The prior art connector has no means of reliably maintaining a secure connection between the bridge clip test prongs and the terminal strips of the connector. Prior art test prongs typically consist of flexible metallic strips that are bent inwardly so as to bias the portion of the prong that contacts the terminal strip against the terminal strip. Such a connection is not reliable, however, as the prongs of the bridge clip are permitted to move within the channel. As such, when the user inserts the bridge clip and performs the test with the testing device, the user must affirmatively hold the bridge clip to the connector so that the electrical connection is secure. Otherwise, any movement of the bridge clip can cause the testing prongs to break the electrical connection with the terminal strips, thereby causing a false test reading. Further, after repeated use, one or both of the testing prongs can bend outwardly thereby causing unreliable connections.

In addition, the prior art connector testing systems do not prevent the user from inadvertently overinserting the bridge clip test leads to a position where the test leads cause damage to the connector. Nor do prior art connector testing systems provide a discernible signal to the user when the bridge clip makes an electrical connection to the bridge clip.

SUMMARY OF THE INVENTION

The present invention is directed at overcoming shortcomings in the prior art. A connector testing system in accordance with the present invention preferably includes a connector, an electrically conductive terminal strip disposed within the connector, a bridge clip preferably having a body and a first test lead connected thereto, and a latch movable between a first position wherein the bridge clip is secured to the connector, and a second position wherein the bridge clip is not secured to the connector. In this manner, the testing system provides a reliable contact between the bridge clip and the terminal strips of the connector during testing procedures.

The connector testing system preferably includes a connector, a terminal strip disposed within the connector and having a receptacle. A bridge clip preferably includes a body and a test lead having a first end and a second end. The receptacle can be sized and constructed to receive the dimple when the second end of the test lead is inserted into the side fold or retention channel, so prevent overinsertion of the test lead into the connector.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference numerals depict like elements throughout the several views:

FIG. 4 is a front elevational view of a bridge clip constructed in accordance with the present invention;

FIG. 5 is a side elevational view of the bridge clip of FIG. 4;

FIGS. 6A and 6B are front elevational cross-sectional views of the bridge clip being inserted into the connector (6A) and being seated within a pair of terminal strips (6B), respectively; and FIGS. 7A and 7B are side elevational views of the bridge clip being inserted into the connector (7A) and being seated within the pair of terminal strips (7B), respectively.

DETAILED DESCRIPTION OF THE PREFERRED EMBODIMENTS

Figure 1:
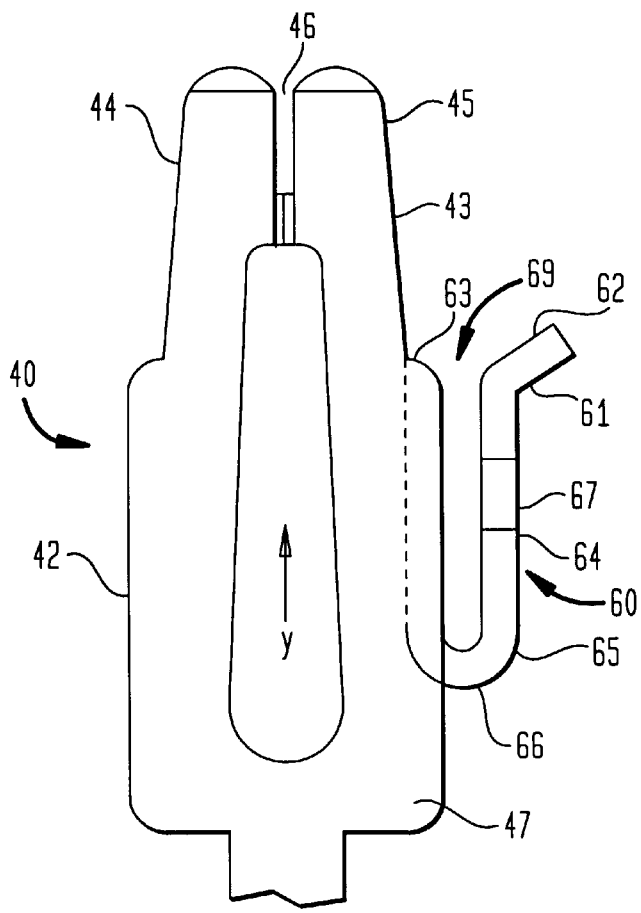
FIG. 1 is a front elevational view of a terminal strip of a connector constructed in accordance with the present invention.

Generally speaking, in accordance the present invention, a connector testing system is provided that provides a more reliable testing configuration.

Referring first to FIGS. 6A and 7A, a connector testing system 50 includes a connector 10, having a pair of terminal strips 40 and a housing 25, and a bridge clip 30. Connector 10 includes a top section, generally indicated as 12, and a bottom section, generally indicated as 14. Top section 12 is pivotably mounted to bottom section 14 about a fixed axis 82, and includes a cap 17 having a stem 18 and a catch 19. Preferably, cap 17 is generally t-shaped when seen from the side elevational view. Top section 12 has a clasp 15, which is movable between an engaged position and a disengaged position, for engaging top section 12 to bottom section 14. Connector 10 has two entrance apertures 22 that lead to wire insertion holes 20. Wire insertion holes 20 are constructed so as to accept electrical conductors (not shown) in a manner known in the art. Connector 10 also includes housing 25, which is constructed to accept a pair of terminal strips 40 when the top section 12 is in the closed position as is shown in FIGS. 6A and 7A. Housing 25 includes side walls 26, a front wall 27 and a rear wall 28, extending between side walls 26 (FIG. 7A), and a base 29, positioned substantially perpendicular to side walls 26, front wall 27 and rear wall 28 and extending therebetween. Base 29 has through holes 29a sized to accept snap fit recesses 41 of terminal strip 40, which are secured through the mating engagement of through holes 29a and snap fit recesses 41 of terminal strip 40.

Connector 10 is preferably formed of a molded synthetic resinous material with good insulating properties and mechanical strength. The specific material utilized in constructing connector 10 are an application-specific matter of design choice within the knowledge of the person of skill familiar with terminal blocks utilized in the telephony art. Moreover, the specific means of affixing terminal strip 40 within connector housing 25 need not be solely by snap fitting as described above, but by numerous methods of affixation known in the art, such as by way of non-limiting example, adhesives, friction fitting, integral molding, screws, and the like, depending on whether ready removal and re-insertion of the terminal is required, as a matter of application-specific design choice.

Figure 3:
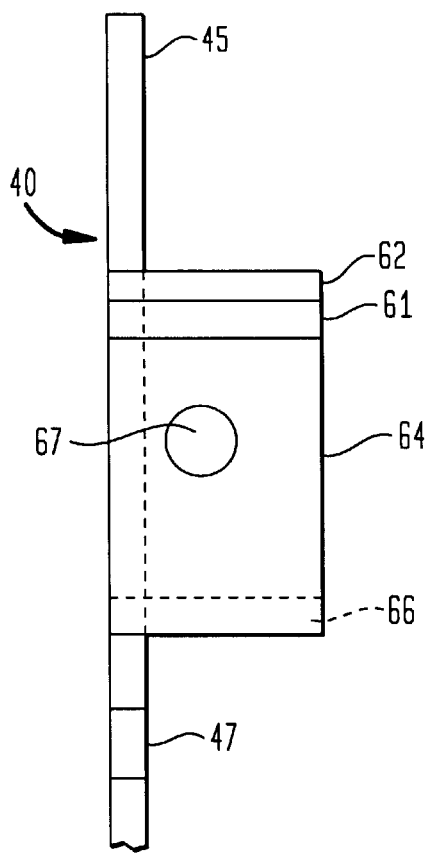
FIG. 3 is a left-side elevational view of the terminal strip of FIG. 1.
Figure 2:
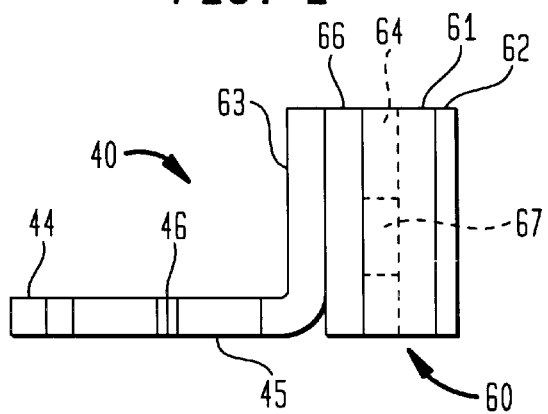
FIG. 2 is a top plan view of the terminal strip of FIG. 1.

With reference to FIGS. 1 through 3, an elongated terminal strip 40 of the present invention is shown in greater detail. Terminal strip 40 has a longitudinal axis extending in a direction shown as arrow Y in FIG. 1, and includes a first arm 42, having a first tip 44, and a second arm 43, having a second tip 45. First tip 44 and second tip 45 form a wire gripping region 46 for retaining an electrical conductor (not shown) that has been inserted into wire insertion holes 20 of top section 12 of connector 12. Terminal strip 40 includes a base 47 formed by first arm 42 and second arm 43 at the end opposite tips 44, 45.

Terminal strip 40 also includes a side fold or pocket for forming a retention channel, generally indicated as 60, having a connector plate 63. Preferably, side fold 60 is generally u-shaped in the elevational view as shown in FIG. 1, but may be shaped in any manner, provided that it is constructed so as to retain the leading edge of a test probe lead when the lead is inserted within side fold 60, as discussed further below. In this manner, side fold 60 forms a test point for testing the integrity of a circuit of which terminal strip 40 is a part. Side fold 60 is preferably, though not necessarily, integrally formed with terminal strip 40, but may be attached by any means know to those skilled in the art, such as by way of non-limiting example, friction fitting, integral molding, screws, and the like. Further, those skilled in the art will recognize that side fold 60 may be attached to either side of terminal strip 40; i.e., to first arm 44 or to second arm 45, or to any structure adjacent terminal strip 40. Side fold 60 further includes a retention plate 64 positioned substantially parallel to connector plate 63. Retention plate 64 has a free end 61 and a fixed end 65 and is resiliently connected to connector plate 63 by an elbow 66. Connector plate 63, elbow 66 and retention plate 64 may all be integrally formed with terminal strip 40, or simply positioned in close proximity thereto. Side fold 60 has an opening 69 formed near free end 61 sized to receive the end of a test lead. Retention plate 64 optionally has a receptacle 67 for engaging the test lead of a bridge clip (described below). Receptacle 67 may take the form of a throughhole, a bore or an indentation. Free end 61 preferably also includes a flared portion 62 for guiding the bridge clip test lead to its seated position.

In an alternative embodiment, shown in FIG. 6A, side fold 60 is pinched at free end 61 so that, in the absence of a test lead, free end 61 of retention plate 64 is biased against connector plate 63. In this embodiment, when a test lead of a bridge clip is inserted within side fold 60, side fold 60 acts as a spring or clip and retention plate 64 is biased and retained against the test lead to reliably secure the test lead and provide a stable electrical contact.

In all embodiments, terminal strip 40, including side fold 60, may be formed of any commonly known electrically conductive metal or electrical conductor known in the art and suitable for use in such terminals, such as, for example, platinum-washed phosphor bronze, or beryllium-cooper alloy or any other material, metal or alloy combining good electrical conductivity with sufficient mechanical strength and resilience.

Referring to FIGS. 4 and 5, bridge clip 30 is depicted in greater detail. Bridge clip 30 includes a body 31, and test leads 32, 33 and electrical conductors 34, 35. Test lead 32 and conductor 34 are connected to body 31 at connection region 36, and test lead 33 and conductor 35 are connected to body 31 at connection region 37. Test lead 32 has an end 32a and forms an electrical connection through connection region 36 and electrical conductor 34 to a testing device (not shown). Likewise, test lead 33 has an end 33a and forms an electrical connection through connection region 37 and electrical conductor 35 to the testing device. Test leads 32, 33 are preferably straight, flat electrically conductive blades having dimples or projections 38, 39, respectively, formed on a lower portion of leads 32, 33. Dimples 38, 39 are preferably substantially hemispherical and are positioned such that when test leads 32, 33 are positioned within side folds 60 of a pair of terminal strips 40, dimples 38, 39 are accommodated within receptacles 67 of retention plate 64. Dimples 38, 39 can be any shape and receptacles 67 may be sized and constructed to receive dimples 38, 39 so as to provide a reliable electrical connection.

In this manner, a positive latch between bridge clip 30 and connector 10 is provided to eliminate the need for the user to hold bridge clip 30 to connector 10 during testing. Dimples 38, 39 provide improved contact surface area with receptacles 67 of side folds 60 due to the greater surface area of the substantially hemispherical dimples 38, 39 as compared with a flat surface. Further, rather than having the limited contact points generally associated when planar surfaces are brought into contact, dimples 38, 39 contact receptacles 67 all along the outer periphery of the dimple.

By capturing test leads 32, 33 within side folds 60, connector 10 is protected form damage that may be caused by overinsertion of test leads 32, 33 into connector 10. In addition, when dimples 38, 39 are received within receptacles 67 of sidefolds 60, the user feels or discerns a perceptible signal or "click" that indicates, through positive feedback that test leads 32, 33 are properly positioned within side folds 60 and a proper electrical connection has been achieved.

Bridge clip 30 also includes a latch 48 having a first beam 138 formed with a first hook 58, and a second beam 139 formed with a second hook 59. Preferably, beams 138, 139 and hooks 58, 59 are integrally formed with body 31, however, hooks 58, 59 may be connected to beams 138, 139 in any fashion known to those skilled in the art. First hook 58 and second hook 59 are constructed to matingly engage with catch 19 of cap 17 when test leads 32, 33 of bridge clip 30 are inserted into retention plates 64.

Latch 48 is preferably spring-loaded. That is, beams 138 and 139 are elastically deformable and thus act as a release mechanism when a force shown as arrows F is applied to beams 138, 139 thereby deflecting beams 138, 139 inwardly and rotating hooks 58, 59 outwardly from catch 19 in a direction shown by arrow A to disengage from catch 19 as shown in FIG. 7A. Thus, latch 48 is in its open position as shown in FIG. 7A, when beams 138, 139 are deflected inwardly by a force F. Conversely, as shown in FIG. 7B, latch 48 is in its closed position when test leads 32, 33 are inserted into side fold 60 and first hook 58 and second hook 59 engage catch 19 of cap 18.

Thus, positive securement between bridge clip 30 and terminal strips 40 can be ensured by latch 48, by side folds 60 in combination with test leads 32, 33, or by the retention of dimples 38, 39 within receptacles 67. Depending on the application, any one or all three of these devices can be used to ensure reliable contact between bridge clip 30 and connector 10 and eliminate the need to hold bridge clip 30 after inserting bridge clip 30 to contact terminal strips 40.

One example of a connector that utilizes the securement devices described above is depicted in FIGS. 6A, 6B, 7A and 7B. FIGS. 6A and 7A are front and side elevational views, respectively, of test leads 32, 33 of bridge clip 30 just prior to being inserted into side folds 60 of a pair of terminal strips 40 disposed within housing 25 of connector 10. FIGS. 6B and 7B depict test leads 32, 33 of bridge clip 30 seated within side folds 60 of terminal strips 40.

Referring to FIG. 6A, housing 25 is formed to accept a pair of terminal strips 40. To facilitate testing of connections made through the connector, test or insertion channels 70 are formed between housing 25, and top section 12 and bottom section 14 of connector 10 to permit test leads 32 and 33 to be inserted so as to contact terminal strips 40. To secure bridge clip 30 to connector 10, as the user inserts the test leads 32, 33 into test channels 70, the user compresses beams 138 and 139 in the direction shown as arrows F to rotate hooks 58 and 59 outward in the direction shown by arrows A. Once hooks 58 and 59 rotate a distance sufficient to clear catch 19, the user continues to insert test leads 32, 33 until test lead ends 32a, 33a contact flared portions 62 of side folds 60. Further insertion of test leads 32, 33 cause retention plates 64 to rotate in a direction indicated by arrows B until test leads 32, 33 are permitted to slide into side folds 60. As is shown in FIGS. 6B and 7B, upon further insertion of test leads 32, 33 into side folds 60, dimples 138 and 139 seat within receptacles 67. At this time, the user can stop compressing beams 138 and 139, which permits hooks 58 and 59 to rotate to the closed position and engage catch 19 of top section 12 of connector 10. In the fully inserted position, test leads 32, 33 are cupped within side folds 60, and dimples 38, 39 are seated within receptacles 67.

In this manner, the testing configuration provides a more reliable electrical connection and eliminates the need to hold the bridge clip when testing the electrical conductors housed within the connector.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A connector testing system, comprising:
   a connector having a top portion pivotally mounted to a bottom portion comprising a housing having an insertion channel formed between the housing on a first side and the top section and the bottom section on a second side, the insertion channel being so shaped and sized as to receive therein a first test lead;
   said top portion being movable between an open position and a closed position, said top portion having therein at least one wire insertion hole for guidedly receiving a wire, said wire insertion hole having an entrance aperture for entry of said wire, said open position facilitating entry of said wire in said wire insertion hole;
   a first terminal strip disposed within the connector for mechanical and electrical mating with said wire when said top portion is in said closed position;
   a first retention channel formed proximate to the first terminal strip for releasably retaining a portion of the first test lead against the first terminal strip when said test lead is inserted through the insertion channel and into the retention channel;
   a bridge clip having a body and said first test lead connected thereto, and a latch movable between a first position where the bridge clip is secured to the connector, and a second position where the bridge clip is not secured to the connector.

2. The connector testing system of claim 1, wherein the connector includes a cap and the bridge clip is secured to the cap.

3. The connector testing system of claim 1, wherein the test channel is formed adjacent the terminal strip to permit the first test lead to contact the terminal strip when the first test lead is inserted into the test channel.

4. The connector testing system of claim 1, wherein the first retention channel is integrally formed with the first terminal strip.

5. The connector testing system of claim 1, wherein the first retention channel includes a flared portion for guiding the first test lead to a seated position within the first retention channel.

6. The connector testing system of claim 1, wherein the first retention channel is substantially U-shaped in one plane.

7. The connector testing system of claim 1, wherein the first retention channel includes a connector plate connected to the first terminal strip and a retention plate connected to the connector plate, the connector plate and retention plate forming a pocket for receiving a portion of the first test lead.

8. The connector testing system of claim 7, wherein the retention plate includes a free end, and the free end is biased toward the connector plate.

9. The connector testing system of claim 7, wherein the first test lead includes a dimple formed on a free end thereof and the first retention channel has a receptacle formed to receive the dimple.

10. The connector testing system of claim 1, wherein the connector includes a second terminal strip disposed within the housing, the bridge clip includes a second lead connected to the body, a second insertion channel formed between the housing on a first side and the top section and the bottom section on a second side, and a second retention channel connected to the second terminal strip, the second retention channel shaped and sized to retain a portion of the second test lead.

11. A connector, comprising:

a housing having a bottom section and a top section pivotably mounted thereto;

a terminal strip disposed within the housing;

the housing having a first insertion channel formed between the housing on a first side, and the top section and the bottom section on a second side, the insertion channel being shaped and sized to receive therein a free end of a test lead of a bridge clip; and a retention channel connected to the terminal strip constructed to retain a portion of the test lead when the test lead is inserted through the insertion channel and into the retention channel.

12. The connector of claim 11, wherein the retention channel is integrally formed with the terminal strip.

13. The connector of claim 11, wherein the retention channel includes a flared portion for guiding the test lead to a seated position within the retention channel.

14. The connector of claim 11, wherein the retention channel is substantially U-shaped in one plane.

* * * * *